(12) United States Patent
Kawasaki

(10) Patent No.: US 7,030,019 B2
(45) Date of Patent: Apr. 18, 2006

(54) SEMICONDUCTOR DEVICE FABRICATION METHOD

(75) Inventor: Takashi Kawasaki, Fukuyama (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 11/147,424

(22) Filed: Jun. 8, 2005

(65) Prior Publication Data

US 2005/0282389 A1  Dec. 22, 2005

(30) Foreign Application Priority Data

Jun. 18, 2004 (JP) ............................ 2004-181390

(51) Int. Cl.
*H01L 21/302* (2006.01)
*H01L 21/461* (2006.01)

(52) U.S. Cl. ...................... 438/692; 438/693

(58) Field of Classification Search ............... 438/633, 438/692, 693, FOR. 111; 252/79.2; 216/52, 216/89

See application file for complete search history.

(56) References Cited

U.S. PATENT DOCUMENTS

| 2002/0034848 | A1* | 3/2002 | Park ........................... 438/239 |
| 2004/0002209 | A1* | 1/2004 | Lee et al. .................... 438/631 |
| 2004/0014321 | A1* | 1/2004 | Kwon et al. ................ 438/692 |
| 2004/0154231 | A1* | 8/2004 | Lee et al. ..................... 51/309 |

* cited by examiner

*Primary Examiner*—George Fourson
*Assistant Examiner*—Michelle Estrada
(74) *Attorney, Agent, or Firm*—Nixon & Vanderhye P.C.

(57) ABSTRACT

A semiconductor device fabrication method according to the invention comprises the steps of: (1) exposing a silicon layer by removing a portion of an insulating layer above a projected part of the silicon layer, the insulating layer covering the silicon layer; and (2) chemically and mechanically polishing the exposed silicon layer with a polishing slurry for the silicon layer while protecting the silicon layer with the remaining of the insulating layer.

18 Claims, 5 Drawing Sheets

SEMICONDUCTOR DEVICE FABRICATION METHOD

CROSS-REFERENCE TO RELATED APPLICATION

This application is related to Japanese application No.2004-181390 filed on Jun. 18, 2004 whose priority is claimed under 35 USC §119, the disclosure of which is incorporated by reference in its entirety.

BACKGROUND OF THE INVENTION

1. Field of the Invention

The invention relates to a technique of chemical mechanical polishing of a substrate having non-flat shape with projected and recessed parts on the surface, particularly, a technique of chemically and mechanically polishing a silicon layer formed on a substrate so as to level the silicon layer. The invention is preferably applied to formation of a gate electrode and a contact plug formed of a leveled silicon layer.

2. Description of Related Art

An integrated circuit is generally formed on a substrate by continuous deposition of conductive, semiconductive, and insulating layers on a silicon wafer. After deposition of the respective layers, the respective layers are sometimes etched to provide circuit characteristics. To form a conductive path between thin film circuits, a step of the fabrication process may include formation of a plurality of via holes, plugs and lines. Further, to form electrodes with various shapes of thin film circuits, formation of a plurality of conductive units, for example, electrodes of a transistor and a capacitor is also included in a step of the fabrication process. These via holes, plugs, lines, electrodes and other conductive units can be formed by depositing a silicon layer such as a polycrystalline silicon (polysilicon or p-Si) layer on a patterned insulating layer and leveling the silicon layer by polishing or etching the silicon layer until the insulating layer is exposed. The portions of the silicon layer left between neighboring raised patterns of the insulating layer form the via holes, plugs, lines, electrodes and other conductive units.

A chemical mechanical polishing (CMP) method is one of commonly known methods of leveling a silicon layer or exposing an underlaid insulating layer using a polishing pad and a slurry. Effective CMP process provides a flat substrate surface without small-scale unevenness, large-scale topography or shape difference. In addition, the CMP process suppresses dishing (excess polishing of a silicon layer so as to make the silicon layer lower than the insulating layer) and corrosion (removal of the insulating layer) to the minimum.

In the case of a self-alignment FET device or the like, transistor electrodes or capacitor electrodes are formed by embedding a silicon layer in recessed parts of the substrate surface Hereinafter, one example of conventional techniques for embedding the silicon layer in the recessed parts of the substrate surface and leveling the substrate surface will be described.

FIGS. 5A and 5B show a conventional leveling technique (see, e.g., JP-A 2002-518845). As shown in FIG. 5A, an insulating layer 15 of silicon oxide or the like is formed on a semiconductor layer 11 of a silicon wafer or the like. The insulating layer 15 is patterned or is formed on a patterned underlayer and thus made to have non-flat outer surface having projected and recessed parts. The insulating layer has a function as a stopper layer at the time of removing projected parts of the silicon layer in the step of chemically and mechanically polishing the silicon layer thereafter.

Further, over the entire face of the above-mentioned substrate, a polycrystalline silicon layer 13 is formed so as to cover the insulating layer 15. As illustrated, the outer surface of the polycrystalline silicon layer 13 reproduces the surface structure of the underlayer including the insulating layer 15 and form a series of recessed parts and projected parts so as to make the exposed face non-flat.

Next, using a polycrystalline silicon polishing slurry, the polycrystalline silicon layer 13 on the insulating layer is removed by chemical mechanical polishing. Accordingly, an embedded pattern of the polycrystalline silicon is formed in the recessed parts the insulating layer 15.

However, in this method, the polycrystalline silicon layer in the recessed parts of the substrate surface is exposed constantly to the polycrystalline silicon polishing slurry and a polishing pad. As shown in FIG. 5B, dishing of the silicon layer occurs to make the thickness of the embedded polycrystalline silicon layer uneven.

Particularly, in the case of a silicon layer pattern with 1 µm or larger in width, the dishing is significant. This excess polishing of the silicon layer makes the thickness of the embedded silicon layer to be wiring or electrodes uneven or eliminates the silicon layer regions to result in unevenness of the transistor characteristics and wiring resistance or electrode elimination or wiring disconnection and thus the process yield is lowered.

SUMMARY OF THE INVENTION

In view of the above state of the art, the invention provides a semiconductor device fabrication method capable of suppressing dishing of a silicon layer and stably providing flatness of the silicon layer by a simple method.

A semiconductor device fabrication method according to the invention comprises the steps of: (1) exposing a silicon layer by removing a portion of an insulating layer above a projected part of the silicon layer, the insulating layer covering the silicon layer; and (2) chemically and mechanically polishing the exposed silicon layer with a polishing slurry for the silicon layer while protecting the silicon layer with the remaining of the insulating layer.

According to the invention, while the portion other than projected parts of a silicon layer being protected with an insulating layer, the projected parts of the silicon layer are chemically and mechanically polished and therefore the portion protected with the insulating layer is not removed at the time of polishing and occurrence of dishing of the silicon layer can be prevented.

Consequently, according to the invention, the silicon layer can precisely be leveled. As a result, the film thickness of the silicon layer in an embedding region can be made even and transistors and wiring can be formed evenly and thus the process yield can be improved.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENTS

1. First Embodiment

Figure 1A:
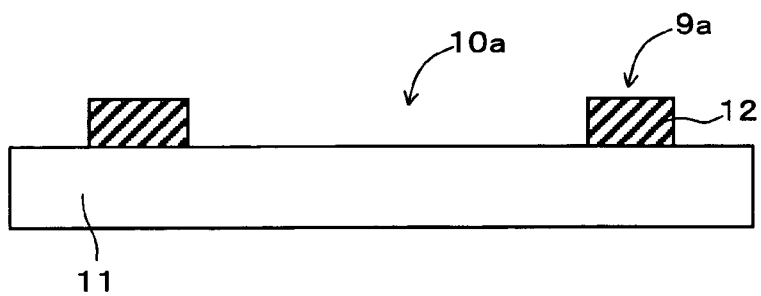
FIGS. 1A to 1C are cross-sectional views each showing a fabrication step of a semiconductor device according to Example 1 of the invention.

A semiconductor device fabrication method according to a first embodiment of the invention comprises the steps of: (1) exposing a silicon layer by removing a portion of an insulating layer above a projected part of the silicon layer, the insulating layer covering the silicon layer; and (2) chemically and mechanically polishing the exposed silicon layer with a polishing slurry for the silicon layer while protecting the silicon layer with the remaining of the insulating layer.

1-1. Step of Exposing a Silicon Layer by Removing a Portion of an Insulating Layer Above a Projected Part of the Silicon Layer, the Insulating Layer Covering the Silicon Layer A silicon layer may be a polycrystalline silicon layer, an amorphous silicon layer or a single crystal silicon layer. Further, the term "silicon layer" includes a layer of silicon alloy such as silicon germanium.

A silicon oxide such as silicon dioxide or a silicon nitride can be used for the insulating layer covering the silicon layer. The insulating layer covering the silicon layer may be a spontaneously oxidized layer of silicon oxide formed by spontaneous oxidation of the silicon layer.

Removal of the portion of the insulating layer above the projected part of the silicon layer can be carried out by chemical mechanical polishing using a polishing slurry for the insulating layer having a property of selectively removing a projected part. The polishing slurry for the insulating layer having the property of selectively removing a projected part is, for example, a ceria type slurry. The ceria type slurry has non-Preston property (the property that it scarcely has polishing capability in threshold pressure or lower and shows remarkably sharply increased polishing capability in the case the pressure exceeds the threshold pressure), so that it can selectively remove only the projected part of the insulating layer. The ceria type slurry means a slurry containing cerium oxide as abrasive grains. As the ceria type slurry, HS-8005 Model made by Hitachi Chemical Co., Ltd., SEIMICRON CES 303 Model made by Asahi Glass Co., Ltd., and Microplanar STI 2100 Model made by EKC Technology Co., Ltd. can be used.

Further, removal of the portion of the insulating layer above the projected part of the silicon layer can be carried out by forming a mask layer of photoresist or the like on a region other than the portion above the projected part (or a region between neighboring projected parts) and removing the portion above the projected part by etching. The polishing slurry for the insulating layer is not particularly limited if the slurry has a property of selectively removing a projected part and a silica slurry having non-Preston property can also be used.

1-2. Step of Chemically and Mechanically Polishing the Exposed Silicon Layer With a Polishing Slurry for the Silicon Layer While Protecting the Silicon Layer With the Remaining of the Insulating Layer The portion of the insulating layer above the projected part of the silicon layer is removed and the other portion of the insulating layer are left. While the silicon layer being protected with the remaining of the insulating layer, the chemical mechanical polishing of the silicon layer is carried out and therefore dishing owing to removal of the portion other than the projected part of the silicon layer is not caused. Here, chemical mechanical polishing is a method comprising the steps of applying a slurry which chemically reacts with a target layer on the target layer, and mechanically eliminating a surface layer generated by a reaction between the slurry and the target layer by polishing. Chemical mechanical polishing may be performed by a machine named MIRRA made by APPLIED MATERIALS, Inc.

The silicon layer is preferably polished until the layer is leveled. The leveling is carried out, for example, by using the remaining of the insulating layer as a stopper layer.

When the silicon layer is formed of a polycrystalline silicon layer, an amorphous silicon layer or a single crystal silicon layer, the polishing slurry for the silicon layer may be a polishing slurry for the polycrystalline silicon layer, the amorphous silicon layer or the single crystal silicon layer, respectively. As the slurry mentioned above, PLANER-LITE-6103 Model made by Fujimi Inc. or Semi-Sperse P1000 Model made by Cabot Microelectronics Corp. can be used.

Further, the polishing slurry for the silicon layer preferably has a property that the selectivity of the silicon layer to the insulating layer is three or larger. In such a case, the selectivity is sufficiently high and the insulating layer effectively works as a protection layer or a stopper layer.

1-3. Others

The fabrication method of this embodiment is preferable to further comprise a step of removing the insulating layer after the chemical mechanical polishing of the silicon layer. By removing the insulating layer, the entire face of the silicon layer is exposed. Removal of the insulating layer can be carried out by a dry etching method such as a RIE (Reactive Ion Etching) method using a gas mixture of $C_xF_y$ type gas, $O_2$ gas and Ar gas or a wet etching method using an etching solution such as hydrofluoric acid.

2. Second Embodiment

A semiconductor device fabrication method according to a second embodiment of the invention comprises the steps of: (1) forming a silicon layer having a thickness substantially the same as or thinner than the height of a projected part on a substrate so as to cover the surface of the substrate, the projected part being formed of a first insulating layer; (2) forming a second insulating layer covering the silicon layer; (3) exposing the silicon layer by removing a portion of the second insulating layer above the projected part on the substrate; (4) substantially leveling the silicon layer and exposing the first insulating layer by chemically and mechanically polishing the exposed silicon layer while protecting the silicon layer with the remaining of the second insulating layer and using the remaining of the second insulating layer or the projected part of the first insulating layer as a stopper layer; and (5) removing the remaining of the second insulating layer.

The contents described in the first embodiment can be applied also in this embodiment unless contrary to the spirit. Accordingly, in this embodiment, the description in common with the first embodiment will not be repeated.

2-1. Step of Forming a Silicon Layer Having a Thickness Substantially the Same as or Thinner Than the Height of a Projected Part on a Substrate so as to Cover the Surface of the Substrate, the Projected Part Being Formed of a First Insulating Layer A first insulating layer is formed on a substrate and a projected part is thus formed of the first insulating layer. The substrate may be exposed between neighboring projected parts. A thinner insulating layer may be formed therebetween. The projected part formed of the first insulating layer may be formed only of the first insulating layer or may be formed by covering a projected part of the substrate with the first insulating layer (in other words, the projected part of the first insulating layer may be reflection of a projected part of the substrate).

The first insulating layer may be formed of silicon oxide or silicon nitride. The projected part formed of the first insulating layer can be formed by forming an insulating layer on the entire surface of the substrate by a CVD method and patterning the insulating layer by photolithography and etching techniques.

A silicon layer is formed on the surface of the substrate so as to cover the surface of the substrate. The silicon layer has a thickness substantially the same as or thinner than the height of the projected part in this embodiment. Since the silicon layer is formed so as to have such a thickness, the silicon layer can be leveled and simultaneously the first insulating layer can be exposed in the step carried out thereafter. In the case the silicon layer is thinner than the height of the projected part of the first insulating layer, the position of the top face of the silicon layer becomes lower than the top face of the projected part of the first insulating layer after the chemical mechanical polishing of the silicon layer in the step thereafter. Such a case is also included in the "leveling" of the silicon layer. Even in such a case, the silicon layer having a substantially constant thickness in the region sandwiched between neighboring two projected parts of the insulating layer can be formed and thus the aim of the invention can be achieved.

The silicon layer is formed by a CVD method or the like and has a substantially constant thickness over the entire region where the layer is formed. Accordingly, the shape of the projected part of the substrate is reflected in the silicon layer as it is.

2-2. Step of Forming a Second Insulating Layer Covering the Silicon Layer

The second insulating layer may be formed of silicon oxide or silicon nitride. The second insulating layer may be made of the same material as or a different material from that of the first insulating layer. The second insulating layer can be formed by a CVD method or the like. The second insulating layer may be formed by thermal oxidation of the silicon layer. Further, a spontaneous oxidation film of the silicon layer may be used as the second insulating layer.

The second insulating layer is preferably made of a material making the selectivity of the silicon layer to the second insulating layer three or larger in a polishing process with a polishing slurry for the silicon layer. That is, when the silicon layer and the second insulating layer are polished with a polishing slurry for the silicon layer, the silicon layer is polished at least three times more than the second insulating layer. In this case, the second insulating layer effectively works as a protection layer or a stopper layer.

Additionally, the second insulating layer may be formed in a recessed part between neighboring projected parts only when the neighboring projected parts are at a distance more than two times larger than the thickness of the silicon layer. It is because in the case the distance between the neighboring projected parts is short, no dishing problem occurs.

2-3. Step of Exposing the Silicon Layer by Removing a Portion of the Second Insulating Layer Above the Projected Part on the Substrate This step can be carried out by, for example, removing the portion of the second insulating layer above the projected part on the substrate by chemical mechanical polishing with a polishing slurry for the insulating layer having a property of selectively removing a projected part. The silicon layer is exposed from the removed portion of the second insulating layer. The slurry and the like are as described in the above 1-1.

2-4. Step of Substantially Leveling the Silicon Layer and Exposing the First Insulating Layer by Chemically and Mechanically Polishing the Exposed Silicon Layer While Protecting the Silicon Layer With the Remaining of the Second Insulating Layer and Using the Remaining of the Second Insulating Layer or the Projected Part of the First Insulating Layer as a Stopper Layer No dishing problem is caused since the chemical mechanical polishing of the silicon layer is carried out while the silicon layer being protected with the remaining of the second insulating layer.

The thickness of the silicon layer is substantially the same as or thinner than that of the projected part of the first insulating layer. In the case the thickness of the silicon layer is substantially the same as that of the projected part of the first insulating layer, the position of the surface of the remaining of the second insulating layer is higher than the surface of the projected part of the first insulating layer by the extent of the thickness of the second insulating layer. In this case, the chemical mechanical polishing is carried out using the remaining of the second insulating layer as a stopper layer. At that time, the silicon layer on the projected part of the first insulating layer is removed by dishing to expose the first insulating layer. Accordingly, the silicon layer is substantially leveled and the first insulating layer is exposed in this step.

On the other hand, in the case the top face of the remaining of the second insulating layer is lower than the top face of the projected part of the first insulating layer (e.g., the case that the thickness of the silicon layer is thinner than the height of the projected part of the first insulating layer and the total thickness of the silicon layer and the second insulating layer is thinner than the height of the projected part of the first insulating layer), the chemical mechanical polishing is carried out using projected part of the first insulating layer as a stopper layer. Also in this case, as described in the above 2-1, the silicon layer is substantially leveled and the first insulating layer is exposed.

2-5. Step of Removing the Remaining of the Second Insulating Layer

In this step, the remaining of the second insulating layer, which is no longer needed, is removed to expose the entire surface of the silicon layer. The removal of the second insulating layer can be carried out by, for example, a dry etching method such as RIE (Reactive Ion Etching) method using a gas mixture of $C_xF_y$ type gas, $O_2$ gas and Ar gas or a wet etching method using an etching solution such as hydrofluoric acid.

3. Third Embodiment

A semiconductor device fabrication method according to a third embodiment of the invention comprises the steps of: (1) forming a silicon layer having a thickness thicker than the height of a projected part on a substrate so as to cover the surface of the substrate, the projected part being formed of a first insulating layer; (2) forming a second insulating layer covering the silicon layer; (3) exposing the silicon layer by removing a portion of the second insulating layer above the projected part on the substrate; (4) substantially leveling the silicon layer by chemically and mechanically polishing the exposed silicon layer while protecting the silicon layer with the remaining of the second insulating layer and using the remaining of the second insulating layer as a stopper layer; (5) removing the remaining of the second insulating layer; and (6) exposing the first insulating layer by chemically and mechanically polishing the substantially leveled silicon layer.

The contents described in the first and second embodiments can be applied also in this embodiment unless contrary to the spirit. Accordingly, in this embodiment, the description in common with the first and second embodiments will not be repeated.

3-1. Step of Forming a Silicon Layer Having a Thickness Thicker than the Height of a Projected Part on a Substrate so as to Cover the Surface of the Substrate, the Projected Part Being Formed of a First Insulating Layer In this embodiment, a silicon layer with a thickness thicker than the height of the projected part is formed. In this embodiment, leveling of the silicon layer and exposure of the first insulating layer cannot be carried out simultaneously. At first, the silicon layer is leveled and, after that, the silicon layer is further polished to expose the first insulating layer.

3-2. Step of Forming a Second Insulating Layer Covering the Silicon Layer

3-3. Step of Exposing the Silicon Layer by Removing a Portion of the Second Insulating Layer Above the Projected Part on the Substrate These two steps are the same as those in the second embodiment and therefore their description will not be repeated.

3-4. Step of Substantially Leveling the Silicon Layer by Chemically and Mechanically Polishing the Exposed Silicon Layer While Protecting the Silicon Layer With the Remaining of the Second Insulating Layer and Using the Remaining of the Second Insulating Layer as a Stopper Layer In the second embodiment, the silicon layer is leveled and the first insulating layer is exposed, however in this embodiment, the first insulating layer is not exposed in this step.

3-5. Step of Removing the Remaining of the Second Insulating Layer

This step is the same as that in the second embodiment and therefore its description will not be repeated.

3-6. Step of Exposing the First Insulating Layer by Chemically and Mechanically Polishing the Substantially Leveled Silicon Layer In this step, the silicon layer is further chemically and mechanically polished to expose the first insulating layer.

Since the silicon layer is already leveled, a problem of dishing hardly occurs when the chemical mechanical polishing is carried out.

4. Others.

Leveling of the silicon layer is described along with the above-mentioned embodiments, materials (e.g., tungsten) other than the silicon layer can also be leveled and the same effects as those of the above-mentioned embodiments of the invention can be achieved if a stopper layer can be formed selectively in a recessed part of the substrate surface by a polishing slurry having a property of selectively removing a projected part, and an embedded layer is made of a material enabling the selectivity of the embedded layer to the stopper layer to be sufficiently high.

EXAMPLE 1

Hereinafter, along with FIGS. 1A to 1C and FIGS. 2D to 2F, a semiconductor device fabrication method according to Example 1 of the invention will be described. FIGS. 1A to 1C and FIGS. 2D to 2F are cross-sectional views each showing a fabrication process of the semiconductor device of this example.

At first, a first insulating layer 12 of silicon oxide is formed on a semiconductor layer 11 of a silicon wafer to obtain the structure shown in FIG. 1A. The first insulating layer 12 is patterned or formed on a patterned underlayer and thus has a non-flat outer surface having recessed parts 10a and projected parts 9a.

Figure 1B:
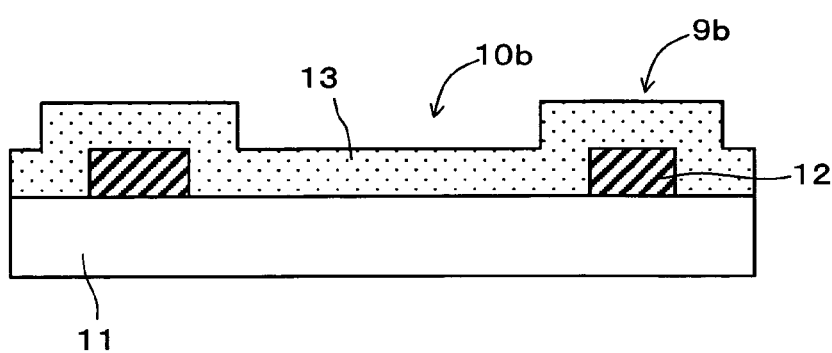

Next, a polycrystalline silicon layer 13 is formed so as to cover the first insulating layer 12 on the entire face of the obtained substrate to obtain the structure shown in FIG. 1B. As illustrated, the outer surface of the polycrystalline silicon layer 13 almost precisely reproduces the surface structure of the underlayer including the first insulating layer 12 and forms a series of the recessed parts 10b and projected parts 9b to make the exposed face of the obtained substrate non-flat. In another embodiment, a layer of different type silicon such as amorphous silicon (a-Si) and single crystal silicon may be used in place of polycrystalline silicon.

Figure 2D:
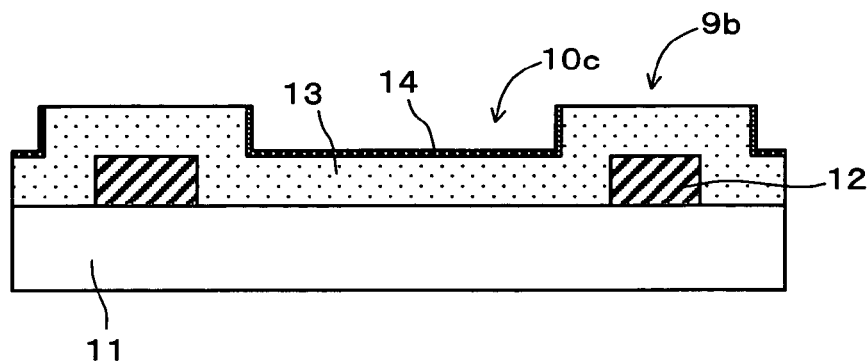
FIGS. 2D to 2F are cross-sectional views each showing a fabrication step of the semiconductor device according to Example 1 of the invention.
Figure 2E:
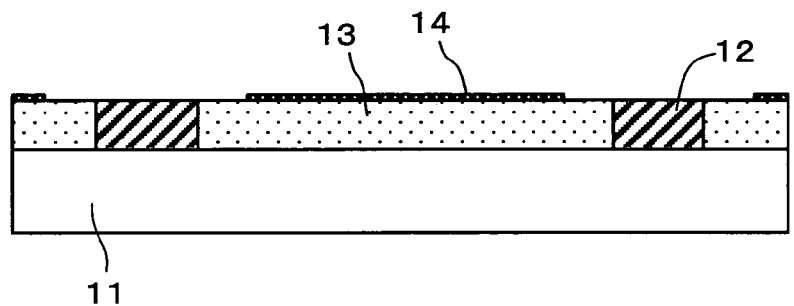
Figure 2F:
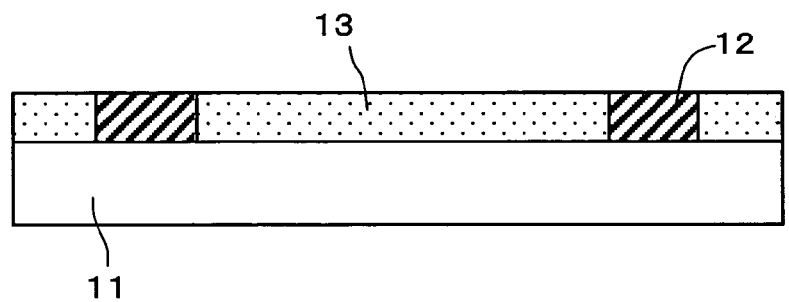

As discussed above, one of the purposes of the leveling is to polish the polycrystalline silicon layer 13 until the top face of the first insulating layer 12 is exposed and to leave via holes, plugs, lines, electrodes and other conductive units of polycrystalline silicon between insulating islands (see FIG. 2F). Accordingly, the thickness of the polycrystalline silicon layer may be approximately the same as or thinner than the difference of the height between the bottom face of the recessed parts 10a of the substrate surface and the top faces of the projected parts 9a of the first insulating layer 12 in FIG. 1A.

Figure 1C:
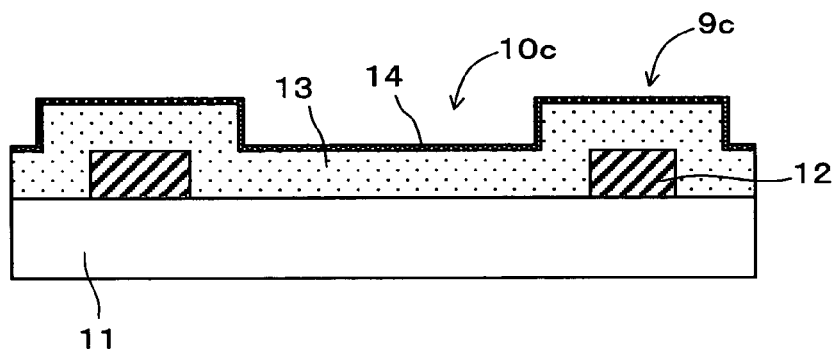

Next, the second insulating layer 14 is formed on the entire surface of the obtained substrate so as to cover the polycrystalline silicon layer 13 and obtain the structure shown in FIG. 1C. As illustrated, the outer surface of the second insulating layer 14 almost precisely reproduces the surface structure of the underlayer and forms a series of the recessed parts 10c and projected parts 9c to make the exposed face of the obtained substrate non-flat.

The second insulating layer 14 can be formed using silicon oxide or silicon nitride. The second insulating layer 14 may be formed on the polycrystalline silicon layer 13 by deposition, for example, by a CVD method or may be formed by oxidation of the outer surface of the polycrystalline silicon layer 13 by a thermal oxidation method.

Next, as illustrated in FIG. 2D, the projected parts 9c of the second insulating layer 14 are removed to expose the projected parts 9b of the silicon layer 13. The remaining (the recessed parts) 10c of the second insulating layer 14 works as a stopper layer in the case of removing the projected parts 9b of the polycrystalline silicon layer 13 in the chemical mechanical polishing of the polycrystalline silicon layer thereafter.

Removal of the projected parts 9c of the second insulating layer 14 can be carried out by chemical mechanical polishing with a polishing slurry for the insulating layer having a property of selectively removing a projected part.

The polishing is performed with a polishing slurry for the silicon layer having a property that selectivity of the polycrystalline silicon layer 13 to the second insulating layer 14 is sufficiently high. Accordingly, the second insulating layer 14 functions as a stopper layer in the second chemical mechanical polishing step for leveling the polycrystalline silicon layer later even if the second insulating layer 14 is considerably thinner than the polycrystalline silicon layer 13. For example, in the case of using a slurry having 1:100 selectivity, the second insulating layer 14 functions sufficiently as a stopper layer if the thickness of the second insulating layer 14 is 1/100 or thicker than the thickness of the polycrystalline silicon layer 13.

As the polishing slurry for the insulating layer having the property of selectively removing a projected part, for example, a ceria type slurry having non-Preston property may be used.

Next, using the polycrystalline silicon polishing slurry and using the recessed parts 10c of the second insulating layer 14 as a stopper layer, the second chemical mechanical polishing is carried out to entirely remove the projected parts 9b of the polycrystalline silicon layer 13 and expose the surface of the first insulating layer 12 and thus the structure shown in FIG. 2E is obtained.

Accordingly, only the polycrystalline silicon layer 13 under the recessed parts 10c of the second insulating layer 14 is selectively left to form embedded regions of the polycrystalline silicon to be via holes, plugs, lines, electrodes and other conductive units.

Finally, the second insulating layer 14 on the embedded polycrystalline silicon layer 13 is removed by a dry etching method such as RIE (Reactive Ion Etching) method using a gas mixture of $C_xF_y$ type gas, $O_2$ gas and Ar gas or a wet etching method using an etching solution such as hydrofluoric acid to complete the leveling treatment (FIG. 2F).

After that, the above-mentioned embedded polycrystalline silicon layer is formed to be electrodes, wiring or the like and thus fabricate a semiconductor device with a high process yield and free from unevenness of transistor characteristics, electrode elimination, unevenness of wiring resistance, disconnection, and the like.

As described above, the projected parts 9b of the polycrystalline silicon layer 13 are completely removed by chemical mechanical polishing using the recessed parts 10c of the second insulating layer 14 as a stopper.

Accordingly, without restriction of surface area size of the embedded polycrystalline silicon layer or without causing dishing of the embedded polycrystalline silicon layer, excellent flat shape can be formed. Consequently, an embedded polycrystalline silicon layer constantly having good flatness and uniform thickness can stably be obtained by a simple method.

Although the leveling of the polycrystalline silicon layer is described, the method of the invention can be applied to leveling of a layer of other type of silicon such as amorphous silicon (a-Si) or single crystal silicon. The polycrystalline silicon polishing slurry may be replaced with an amorphous silicon polishing slurry or a single crystal silicon polishing slurry.

Further, Leveling of the silicon layer is described along with the above-mentioned embodiments, materials (e.g., tungsten) other than the silicon layer can also be leveled and the same effects as those of the above-mentioned embodiments of the invention can be achieved if a stopper layer can be formed selectively in a recessed part of the substrate surface by a polishing slurry having a property of selectively removing a projected part, and an embedded layer is made of a material enabling the selectivity of the embedded layer to the stopper layer to be sufficiently high.

EXAMPLE 2

Hereinafter, along with FIGS. 3A to 3C and FIGS. 4D to 4G, a semiconductor device fabrication method according to Example 2 of the invention will be described. FIGS. 3A to 3C and FIGS. 4D to 4G are cross-sectional views each showing a fabrication process of the semiconductor device of this example.

Figure 3A:
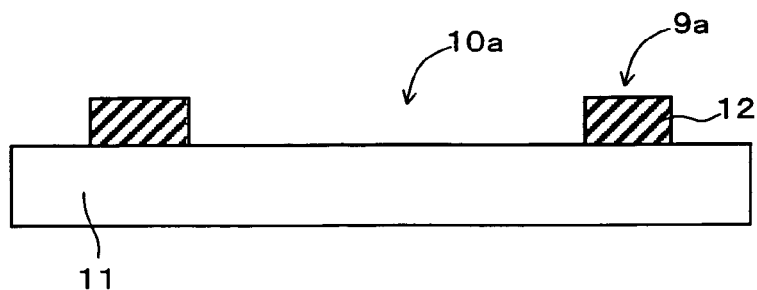
FIGS. 3A to 3C are cross-sectional views each showing a fabrication step of a semiconductor device according to Example 2 of the invention.

At first, a first insulating layer 12 of silicon oxide is formed on a semiconductor layer 11 of a silicon wafer to obtain the structure shown in FIG. 3A. The first insulating layer 12 is patterned or formed on a patterned underlayer and thus has a non-flat outer surface having recessed parts 10a and projected parts 9a. This first insulating layer functions as a stopper layer in the step of chemically and mechanically polishing the leveled silicon layer (see FIG. 4G).

Figure 3B:
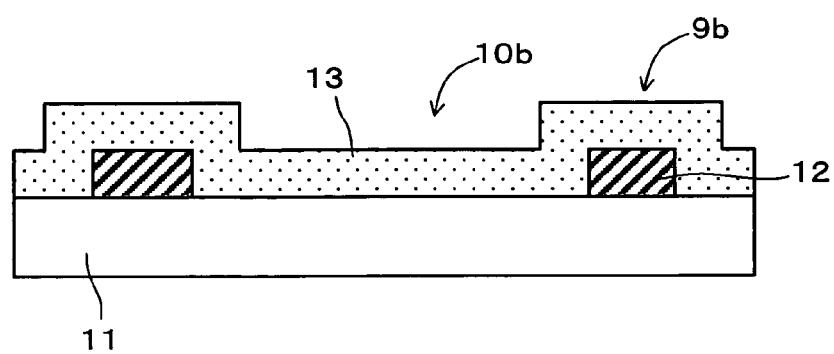

Next, a polycrystalline silicon layer 13 is formed so as to cover the first insulating layer 12 on the entire face of the obtained substrate to obtain the structure shown in FIG. 3B. As illustrated, the outer surface of the polycrystalline silicon layer 13 almost precisely reproduces the surface structure of the underlayer including the first insulating layer 12 and forms a series of the recessed parts 10b and projected parts 9b to make the exposed face of the substrate non-flat. In another embodiment, a layer of different type silicon such as amorphous silicon (a-Si) and single crystal silicon may be used in place of polycrystalline silicon.

Figure 4D:
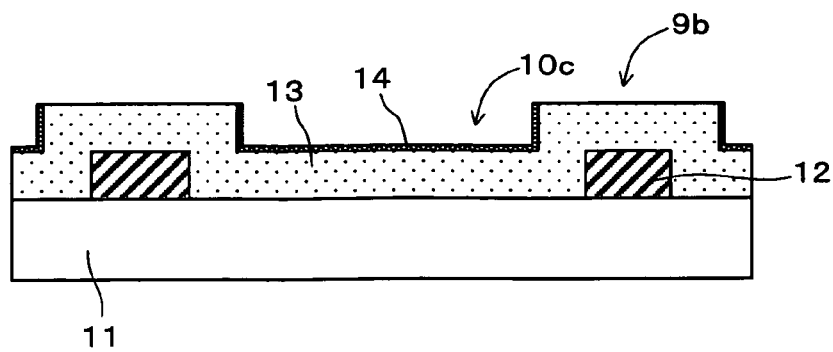
FIGS. 4D to 4G are cross-sectional views each showing a fabrication step of the semiconductor device according to Example 2 of the invention.
Figure 4E:
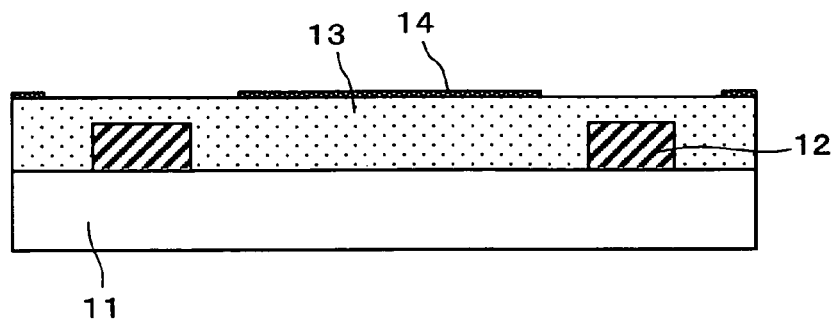
Figure 4F:
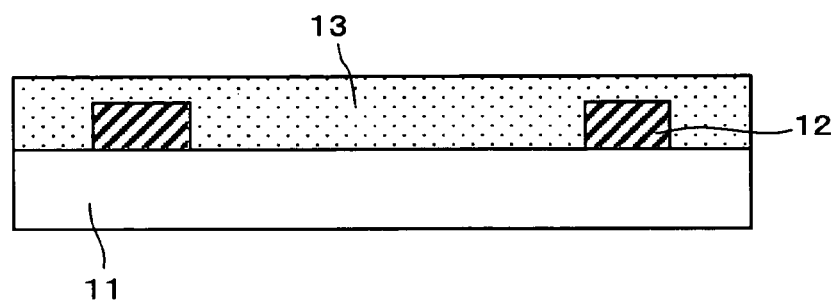
Figure 4G:
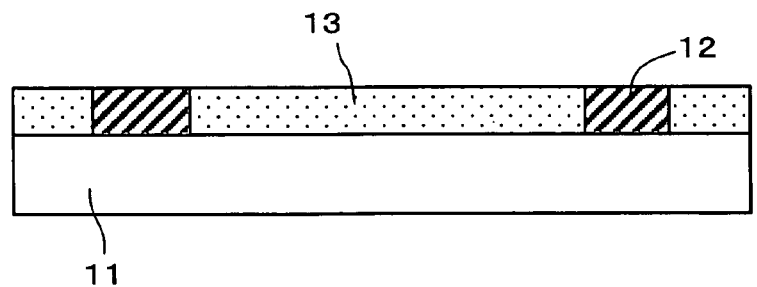
Figure 5A:
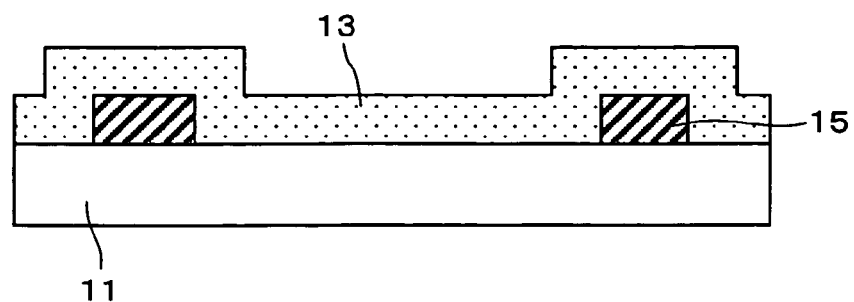
FIGS. 5A and 5B are cross-sectional views each showing a conventional fabrication step of a semiconductor device.
Figure 5B:
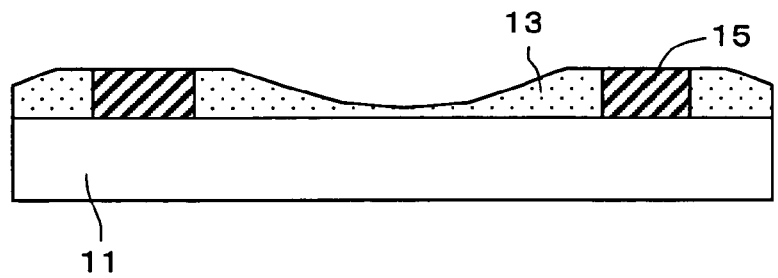

As discussed above, one of the purposes of the leveling is to polish the polycrystalline silicon layer 13 until the top face of the first insulating layer 12 is exposed and to leave via holes, plugs, lines, electrodes and other conductive units of polycrystalline silicon between insulating islands (see FIG. 4G). In the second chemical mechanical polishing step, since leveling is carried out while the polycrystalline silicon layer remains on the projected parts (see FIG. 4E), the thickness of the polycrystalline silicon layer is thicker than the height between the bottom faces of the recessed parts 10a of the substrate surface and the top faces of the projected parts 9a of the first insulating layer in FIG. 3A.

Figure 3C:
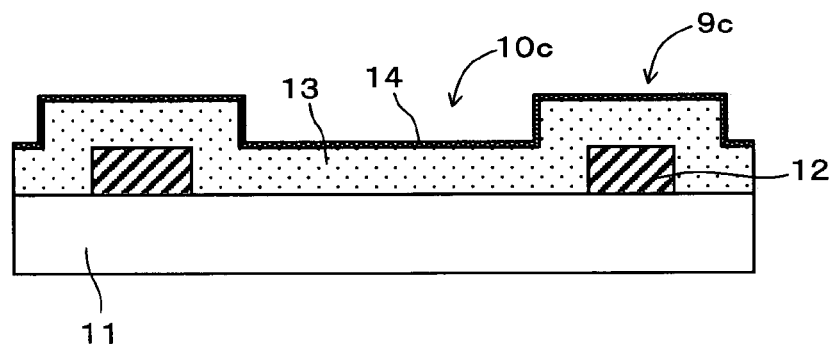

Next, the second insulating layer 14 is formed on the entire surface of the obtained substrate so as to cover the polycrystalline silicon layer 13 and obtain the structure shown in FIG. 3C. As illustrated, the outer surface of the second insulating layer 14 almost precisely reproduces the surface structure of the underlayer and forms a series of the recessed parts 10c and projected parts 9c to make the exposed face of the obtained substrate non-flat.

The second insulating layer 14 can be formed using silicon oxide or silicon nitride. The second insulating layer 14 may be formed on the polycrystalline silicon layer 13 by deposition, for example, by a CVD method or may be formed by oxidation of the outer surface of the polycrystalline silicon layer 13 by a thermal oxidation method.

Next, as illustrated in FIG. 4D, the projected parts 9c of the second insulating layer 14 are removed to expose the projected parts 9b of the silicon layer 13. The remaining (the recessed parts) 10c of the second insulating layer 14 works as a stopper layer in the case of removing the projected parts 9b of the polycrystalline silicon layer 13 in the chemical mechanical polishing of the polycrystalline silicon layer thereafter.

Removal of the projected parts 9c of the second insulating layer 14 can be carried out by chemical mechanical polishing with a polishing slurry for the insulating layer having a property of selectively removing a projected part.

The polishing is performed with a polishing slurry for the silicon layer having a property that selectivity of the polycrystalline silicon layer 13 to the second insulating layer 14 is sufficiently high. Accordingly, the second insulating layer 14 functions as a stopper layer in the second chemical mechanical polishing step for leveling the polycrystalline silicon layer later even if the second insulating layer 14 is considerably thinner than the polycrystalline silicon layer 13. For example, in the case of using a slurry having 1:100 selectivity, the second insulating layer 14 functions sufficiently as a stopper layer if the thickness of the second insulating layer 14 is 1/100 or thicker than the thickness of the polycrystalline silicon layer 13.

As the polishing slurry for the insulating layer having the property of selectively removing a projected part, for example, a ceria type slurry having non-Preston property may be used.

Next, using the polycrystalline silicon polishing slurry and using the recessed parts 10c of the second insulating layer 14 as a stopper layer, the second chemical mechanical polishing is carried out to entirely remove the projected parts 9b of the polycrystalline silicon layer 13 and thus the structure shown in FIG. 4E is obtained. At that time, the first insulating layer 12 is not exposed.

Next, the second insulating layer 14 on the embedded polycrystalline silicon layer 13 is removed by a dry etching method such as RIE (Reactive Ion Etching) method using a gas mixture of $C_xF_y$ type gas, $O_2$ gas and Ar gas or a wet etching method using an etching solution such as hydrofluoric acid to obtain a structure that the outer surface of the polycrystalline silicon layer is leveled (FIG. 4F).

Finally, the third chemical mechanical polishing is carried out using a polycrystalline silicon polishing slurry until the first insulating layer 12 is exposed to complete the leveling treatment. Accordingly, embedded regions of polycrystalline silicon to be via holes, plugs, lines, electrodes and other conductive units are formed in the recessed parts between neighboring first insulating layers 12 (FIG. 4G).

After that, the above-mentioned embedded polycrystalline silicon layer is formed to be electrodes, wiring or the like and thus fabricate a semiconductor device with a high process yield and free from unevenness of transistor characteristics, electrode elimination, unevenness of wiring resistance, disconnection, and the like.

As described above, the projected parts 9b of the polycrystalline silicon layer 13 are completely removed by chemical mechanical polishing using the recessed parts 10c of the second insulating layer 14 as a stopper.

Accordingly, without any restriction of surface area of the embedded polycrystalline silicon layer or without causing dishing of the embedded polycrystalline silicon layer, excellent flat shape can be formed. Consequently, an embedded polycrystalline silicon layer constantly having good flatness and uniform thickness can stably be obtained by a simple method.

Although the leveling of the polycrystalline silicon layer is described, the method of the invention can be applied to leveling of a layer of other type of silicon such as amorphous silicon (a-Si) or single crystal silicon. The polycrystalline silicon polishing slurry may be replaced with an amorphous silicon polishing slurry or a single crystal silicon polishing slurry.

Further, Leveling of the silicon layer is described along with the above-mentioned embodiments, materials (e.g., tungsten) other than the silicon layer can also be leveled and the same effects as those of the above-mentioned embodiments of the invention can be achieved if a stopper layer can be formed selectively in a recessed part of the substrate surface by a polishing slurry having a property of selectively removing a projected part, and an embedded layer is made of a material enabling the selectivity of the embedded layer to the stopper layer to be sufficiently high.

The invention thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor device fabrication method comprising:
    forming a first insulating film directly on and contacting a semiconductor substrate, and patterning the first insulating film to form a plurality of projected parts with recessed parts therebetween so that the first insulating film contacts the semiconductor substrate and forms the projected parts and no film is located between the semiconductor substrate and the first insulating film at the projected parts;
    forming a layer comprising silicon on the projected parts and in the recessed parts;
    forming a second insulating film on the layer comprising silicon, the second insulating film having a thickness less than the first insulating film;
    exposing the layer comprising silicon by removing a portion of the second insulating film above projected parts while leaving in place the second insulating film over substantially portions of the recessed parts; and
    chemically and mechanically polishing the exposed parts of the layer comprising silicon with a polishing slurry while protecting other parts of the layer comprising silicon with the remaining of the second insulating film.

2. The method of claim 1, wherein the exposing step is carried out by chemically and mechanically polishing with a polishing slurry for selectively removing a projected part.

3. The method of claim 1, wherein the first insulating film comprises silicon oxide or silicon nitride.

4. The method of claim 2, wherein the polishing slurry used in removing part of the first insulating film is a ceria type slurry.

5. The method of claim 1, wherein the layer comprising silicon is polished until the layer comprising silicon is leveled.

6. The method of claim 1, wherein the layer comprising silicon is formed of a polycrystalline silicon layer, an amorphous silicon layer or a single crystal silicon layer.

7. The method of claim 1, wherein the layer comprising silicon is formed of a polycrystalline silicon layer, an amorphous silicon layer or a single crystal silicon layer, and the polishing slurry for the layer comprising silicon is a polishing slurry for the polycrystalline silicon layer, the amorphous silicon layer or the single crystal silicon layer, respectively.

8. The method of claim 1, wherein the polishing slurry for the layer comprising silicon has a property that the selectivity of the layer comprising silicon to the second insulating film is three or larger.

9. The method of claim 1, further comprising removing the first insulating film after the chemical mechanical polishing of the layer comprising silicon.

10. The method of claim 1, wherein the layer comprising silicon is a semiconductor layer.

11. A semiconductor device fabrication method comprising:
  (1) forming a silicon layer having a thickness substantially the same as or thinner than the height of a projected part on a semiconductor substrate so as to cover the surface of the substrate, the projected part being formed of a first insulating layer, wherein the first insulating layer is formed directly on and contacting the semiconductor substrate and the first insulating layer is patterned to form at least the projected part and no film is located between the semiconductor substrate and the first insulating layer at the projected part;
  (2) forming a second insulating layer covering the silicon layer;
  (3) exposing the silicon layer by removing a portion of the second insulating layer above the projected part on the substrate;
  (4) substantially leveling the silicon layer and exposing the first insulating layer by chemically and mechanically polishing the exposed silicon layer while protecting the silicon layer in other areas with a remainder of the second insulating layer, and using the remainder of the second insulating layer and/or the projected part of the first insulating layer as a stopper layer; and
  (5) removing the remainder of the second insulating layer.

12. The method of claim 11, wherein step (3) is carried out by chemically and mechanically polishing with a polishing slurry for selectively removing a projected part.

13. The method of claim 11, wherein the second insulating layer is made of a material making the selectivity of the silicon layer to the second insulating layer three or larger in a polishing process with a polishing slurry for the silicon layer.

14. The method of claim 11, wherein the second insulating layer is formed in a recessed part between two projected parts only when the neighboring projected parts are at a distance more than two times larger than the thickness of the silicon layer.

15. A semiconductor device fabrication method comprising:
  (1) forming a silicon layer having a thickness thicker than the height of a projected part on a substrate so as to cover the surface of the substrate, the projected part being formed of a first insulating layer;
  (2) forming a second insulating layer covering the silicon layer;
  (3) exposing the silicon layer by removing a portion of the second insulating layer above the projected part on the substrate;
  (4) substantially leveling the silicon layer by chemically and mechanically polishing the exposed silicon layer while protecting the silicon layer with the remaining of the second insulating layer and using the remaining of the second insulating layer as a stopper layer;
  (5) removing the remaining of the second insulating layer; and
  (6) exposing the first insulating layer by chemically and mechanically polishing the substantially leveled silicon layer,
  wherein the steps (1)–(6) are performed in the order they are recited.

16. The method of claim 15, wherein the step (3) is carried out by chemically and mechanically polishing with a polishing slurry for the insulating layer having a property of selectively removing a projected part.

17. The method of claim 15, wherein the second insulating layer is made of a material making the selectivity of the silicon layer to the second insulating layer three or larger in a polishing process with a polishing slurry for the silicon layer.

18. The method of claim 15, wherein the second insulating layer is formed in a recessed part between two projected parts only when the neighboring projected parts are at a distance more than two times larger than the thickness of the silicon layer.

* * * * *